(12) United States Patent
Manian et al.

(10) Patent No.: US 10,075,156 B2
(45) Date of Patent: Sep. 11, 2018

(54) SYNCHRONOUS CLOCK GENERATION USING AN INTERPOLATOR

(71) Applicant: TEXAS INSTRUMENTS INCORPORATED, Dallas, TX (US)

(72) Inventors: Srikanth Manian, Bangalore (IN); Srinivas Theertham, Bangalore (IN); Jagdish Chand, Bangalore (IN); Dinesh Jain, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/673,166

(22) Filed: Aug. 9, 2017

(65) Prior Publication Data

US 2018/0097512 A1 Apr. 5, 2018

(30) Foreign Application Priority Data

Sep. 30, 2016 (IN) .............................. 201641033591

(51) Int. Cl.
| | |
|---|---|
| *H03M 1/66* | (2006.01) |
| *H03K 5/26* | (2006.01) |
| *H03K 5/135* | (2006.01) |
| *H03L 7/081* | (2006.01) |
| *H03L 7/08* | (2006.01) |
| *H03L 7/07* | (2006.01) |

(Continued)

(52) U.S. Cl.
CPC .............. *H03K 5/26* (2013.01); *H03K 5/135* (2013.01); *H03K 5/1502* (2013.01); *H03L 7/07* (2013.01); *H03L 7/081* (2013.01); *H03L 7/0805* (2013.01); *H03L 7/18* (2013.01)

(58) Field of Classification Search
CPC ........ H03K 5/26; H03K 5/135; H03K 5/1502; H03L 7/07; H03L 7/0805; H03L 7/081; H03L 7/18

USPC .......................... 341/144; 327/155, 271, 291
See application file for complete search history.

(56) References Cited

U.S. PATENT DOCUMENTS 5,926,047 A * 7/1999 Harrison ............... H03L 7/0812
327/155
6,201,424 B1 * 3/2001 Harrison ............... H03L 7/0812
327/155

(Continued)

OTHER PUBLICATIONS

Analog Devices, "JESD204B Clock Generator with 14 LVDS/ HSTL Outputs," Data Sheet, Copyright 2014-2015 Analog Devices, Inc., 68 p.

(Continued)

*Primary Examiner* — Lam T Mai
(74) *Attorney, Agent, or Firm* — John R. Pessetto; Charles A. Brill; Frank D. Cimino

(57) ABSTRACT

In some embodiments, an apparatus comprises a device clock configured to generate a device clock signal a synchronization (SYSREF) clock generation circuit configured to receive the device clock signal from the device clock. The SYSREF clock generating circuit comprises a SYSREF divider configured to generate a SYSREF clock at least partially according to the device clock signal, an interpolator configured to generate a shifted clock at least partially according to the device clock signal, and a latch coupled to the SYSREF divider and the interpolator and configured to sample the SYSREF clock at a rising edge of the shifted clock.

13 Claims, 3 Drawing Sheets

(51) Int. Cl.
*H03L 7/18* (2006.01)
*H03K 5/15* (2006.01)

(56) References Cited

U.S. PATENT DOCUMENTS

| | | | |
|---|---|---|---|
| 6,255,866 B1 * | 7/2001 | Wolaver | G06F 1/025 |
| | | | 327/105 |
| 6,777,995 B1 * | 8/2004 | Harrison | H03K 5/135 |
| | | | 327/271 |
| 2005/0200393 A1 * | 9/2005 | Furtner | G06F 1/08 |
| | | | 327/291 |
| 2006/0055473 A1 * | 3/2006 | Takayama | H03K 3/0315 |
| | | | 331/57 |

OTHER PUBLICATIONS

Jedec, "Serial Interface for Data Converters," Jan. 2012, Standards & Documents Search, 2 p.
Texas Instruments, "LMK0482x Ultra Low-Noise JESD204B Compliant Clock Jitter Cleaner with Dual Leep PLLs," Mar. 2013, Revised Dec. 2015, 113 p.

\* cited by examiner

US 10,075,156 B2

SYNCHRONOUS CLOCK GENERATION USING AN INTERPOLATOR

CROSS-REFERENCE TO RELATED APPLICATIONS

The present application claims priority to Indian Provisional Patent Application No. 201641033591, which was filed Sep. 30, 2016, is titled "A NEW ACCURATE SCHEME FOR JESD204B COMPLIANT SYSREF SIGNAL GENERATION TO MEET TIMING REQUIREMENT FOR RF SAMPLING ADC'S," and is incorporated herein by reference in its entirety.

BACKGROUND

To facilitate interoperability between components of different manufactures and provide for uniformity, standards may be developed that dictate certain threshold requirements for those components to meet to be certified as standards compliant. Some of these threshold requirements may be related to timing, frequency, magnitude, or other such criteria.

SUMMARY

In an embodiment, an apparatus comprises a device clock configured to generate a device clock signal and a synchronization (SYSREF) clock generation circuit configured to receive the device clock signal from the device clock. The SYSREF clock generating circuit comprises a SYSREF divider configured to generate a SYSREF clock at least partially according to the device clock signal. An interpolator is included to generate a shifted clock at least partially according to the device clock signal. A latch is coupled to the SYSREF divider and the interpolator and samples the SYSREF clock at a rising edge of the shifted clock.

Another embodiment is directed to a method that includes receiving a device clock signal, generating a SYSREF clock signal at least partially according to the device clock signal, and generating a shifted clock signal at least partially according to the device clock signal. The method further may include sampling, by a latch, the SYSREF clock signal using the shifted clock signal, and outputting the sampled SYSREF clock signal.

In yet another embodiment, an apparatus configured to generate a SYSREF signal, comprising a frequency divider configured to generate the SYSREF signal by dividing a device clock signal to a frequency less than about 100 megahertz (MHz), an analog phase interpolator configured to generate a delay signal by dividing the device clock signal to form a first clock signal and a second clock signal having a phase shift of 90 degrees with respect to the first clock signal, and a latch configured to output the SYSREF signal according to the delay signal.

BRIEF DESCRIPTION OF THE DRAWINGS

For a detailed description of various examples, reference will now be made to the accompanying drawings.

DETAILED DESCRIPTION

Figure 1:
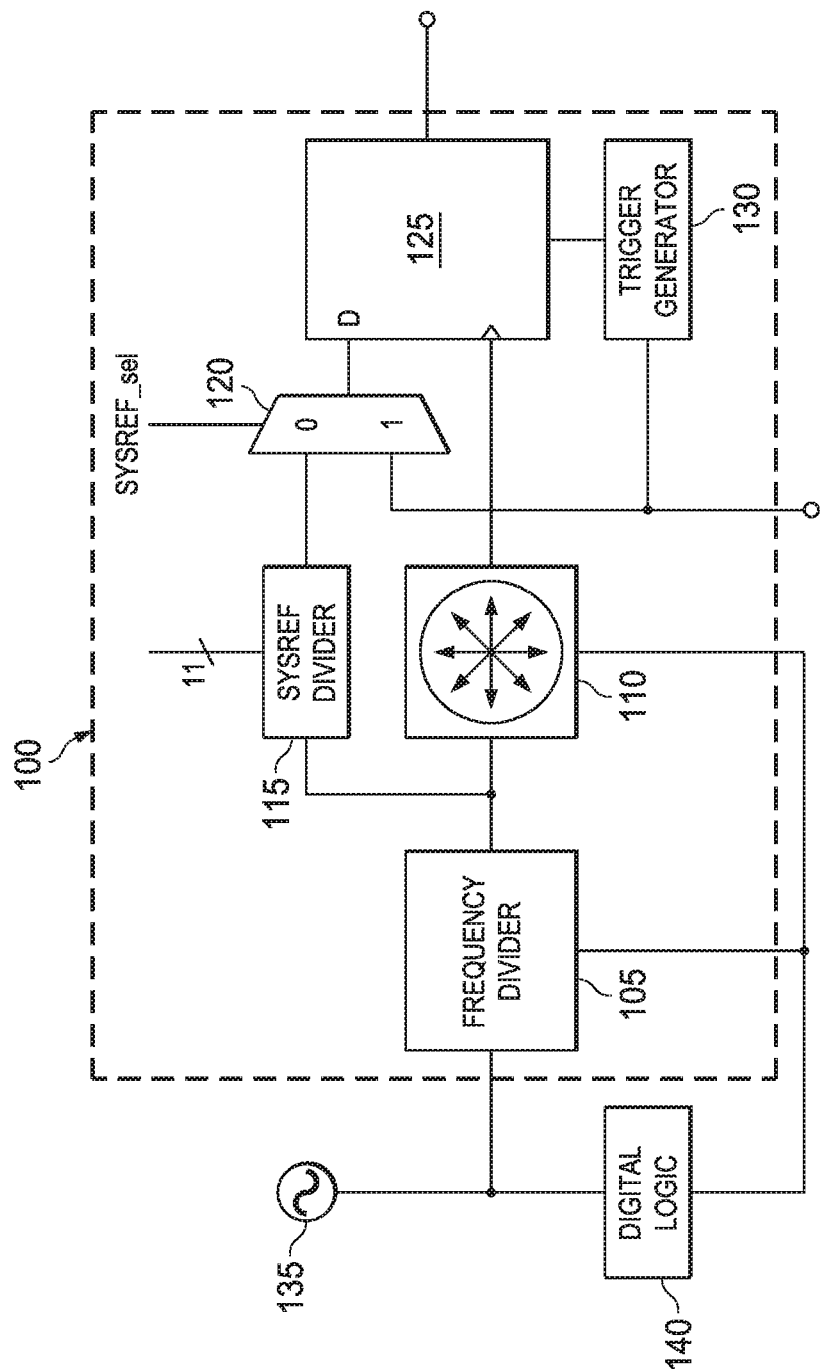
FIG. 1 shows a schematic diagram of an illustrative SYSREF generation circuit in accordance with various embodiments.

A synchronization (or synchronous) signal, sometimes referred to as a system reference or SYSREF signal, is used in some embodiments of electronic devices to establish and/or maintain synchronization between multiple components of the electronic device. Various systems may have different device clock frequencies, each of which may result in different timing requirements for a SYSREF clock. For example, for a system having a device clock of 10 gigahertz (GHz), a window in which the SYSREF clock is permitted to be present may be about 25 picoseconds (pS), and a system having a device clock of 12 GHz may have a window of about 20.83 pS in which the SYSREF clock is permitted to be present. A system having a device clock of 15 GHz or 20 GHz may have a window of about 16.67 pS or 12.5 pS, respectively, in which the SYSREF clock may be present. Accordingly, for various device clock frequencies, timing windows for SYSREF clocks may vary. The timing window may be defined, for example, according to setup and hold timing characteristics for the SYSREF clock relative to the device clock. As a result, it may be desirable to precisely delay or move a SYSREF clock until a desired time (e.g., such that the SYSREF clock signal has a rising edge located within the window defined according to setup and hold timing characteristics for the SYSREF clock relative to the device clock). This may be achieved through the use of highly granular delay steps to enable a SYSREF generation circuit to provide a SYSREF clock within the window provided by the device clock frequency.

Disclosed herein are embodiments that provide for generation of an adjustable Joint Electron Device Engineering Council (JEDEC) JESD204B standard compliant SYSREF clock that is synchronous with a device clock. For example, in various embodiments the device clock may be a clock having a frequency at least on an order of GHz such as a device clock greater than about 1 GHz, greater than about 10 GHz, greater than about 12 GHz, greater than about 15 GHz, or any other comparatively high frequency. In some embodiments, the SYSREF clock may be controllable such that the SYSREF clock is delayed, for example, to position a rising edge of the SYSREF clock within a prescribed window (which may be referred to as a valid assertion window). The prescribed window may be defined, in some embodiments, for each component in the system (e.g., such as an analog-to-digital converter (ADC) and, as such, may vary from component to component. The prescribed window may be further defined according to setup and hold timing characteristics for the SYSREF clock relative to the device clock for a given component of the system. The delay may be determined, in at least some embodiments, using an interpolator such as an analog phase interpolator. The interpolator may comprise one or more digital to analog converters (DACs) configured to tune a clock signal to delay the SYSREF clock, where a granularity of the delay is determined at least in part according to a number of bits of input received by the DACs. In some embodiments (e.g., when the interpolator receives 24 bits of input, corresponding to 6 bits of input for each of four DACs of the interpolator, and the device clock is about 15 GHz), the SYSREF clock may be controllable by the interpolator to a granularity of about 8.5 pS such that a delay between a first rising edge of the SYSREF clock and a second rising edge of the SYSREF clock is about 8.5 pS. Generally, the granularity of the SYSREF clock may be dependent on the device clock frequency and a resolution of the DACs of the interpolator. For example, when the interpolator receives greater than 24 bits of input for each of the digital to analog converters and the device clock is about 15 GHz, the SYSREF clock may be controllable by the interpolator to a granularity of less than about 8.5 pS (e.g., to about 4.25 pS or less).

FIG. 1 is a schematic diagram of an illustrative SYSREF generation circuit 100 in accordance with various embodiments. The disclosed SYSREF generation circuit 100 comprises a frequency divider 105, an interpolator 110, a SYSREF divider 115, a multiplexer 120, a latch 125 (e.g., which may be a flip-flop, D-flip-flop, or other form of triggerable storage and/or output device), and trigger generator 130. The SYSREF generation circuit 100, in this embodiment, is coupled to a device clock 135 and to digital logic 140. In some embodiments, an input of each of the interpolator 110 and the SYSREF divider 115 are coupled to an output of the device clock 135. In other embodiments, the inputs of the interpolator 110 and the SYSREF divider 115 are coupled to an output of the frequency divider 105, which, in turn, has an input coupled to the output of the device clock 135. The SYSREF divider 115, in some embodiments, is further coupled to processing logic (e.g., such as the digital logic 140) configured to provide the SYSREF divider 115 with a value for use in dividing a signal received by the SYSREF divider 115. The processing logic, in some embodiments, is located outside or external to the SYSREF generation circuit 100. The processing logic may be implemented, for example, as a field programmable gate array (FPGA) or other form of digital processing logic capable of receiving the device clock signal, simultaneously issuing reset commands to at least some components of the SYSREF generation circuit 100 and other components in a device that comprises the SYSREF generation circuit 100, and providing other digital logic commands, instructions, or values (e.g., such as values to the frequency divider 105 and/or the SYSREF divider 115 or triggers to the trigger generator 130).

An output of the SYSREF divider 115 is coupled, in some embodiments, to a first data input of the multiplexer 120. A second data input of the multiplexer 120 may be coupled to a trigger input of the SYSREF generation circuit 100. The trigger input of the SYSREF generation circuit 100 may be, in some embodiments, a multipurpose input that may provide an external clock signal to the multiplexer for use in lieu of the output of the SYSREF divider 115, and/or may provide an instruction to the trigger generator 130 to trigger output of the SYSREF clock (e.g., the shift clock signal) by the SYSREF generation circuit 100, as discussed in greater detail below. A control input of the multiplexer 120 may be coupled to processing logic (e.g., such as the digital logic 140) configured to provide the multiplexer with a selection signal (e.g., SYSREF_sel) that selects one of the respective inputs of the multiplexer 120 for output by the multiplexer 120. In some embodiments, an output of the multiplexer 120 is coupled to a data input of the latch 125.

An output of the interpolator 110 of the example of FIG. 1 is coupled to a clock input of the latch 125 and an output of the latch 125 may be provided by the SYSREF generation circuit 100 as the SYSREF clock. In some embodiments, the output of the latch 125 may be coupled to a buffer (not shown) such that the SYSREF generation circuit 100 is electrically isolated from components or devices which receive the SYSREF clock and the SYSREF clock is driven by the buffer. The latch 125 is also coupled, in some embodiments, to the trigger generator 130, for example, via a set or trigger pin of the latch 125, such that receipt of a trigger generated by the trigger generator causes the latch 125 to output the SYSREF clock. For example, the trigger generator 130 may receive an instruction to trigger output of the SYSREF clock by the SYSREF generation circuit 100 and transmit a trigger to the latch 125 to cause the output of the SYSREF clock. The instruction to trigger the output of the SYSREF clock by the SYSREF generation circuit 100, in some embodiments, may be referred to as a SYSREF_REQ signal. The instruction indicates, in some embodiments, a request of a component coupled directly, or indirectly, to the SYSREF generation circuit 100 to receive the SYSREF clock.

In embodiments in which the SYSREF generation circuit 100 receives an external clock signal via the trigger input, the external clock signal may be provided substantially simultaneously to the multiplexer for use in lieu of the output of the SYSREF divider 115 and to the trigger generator 130 as the instruction to trigger output of the SYSREF clock by the SYSREF generation circuit 100. In some embodiments, for example, such as when the external clock signal is selected for output by the multiplexer 120, the trigger generator 130 may hold the latch 125 open such that an input received by the latch 125 is substantially immediately output by the latch 125. For example, trigger generator 130 may cause latch 125 to enter an asynchronous pass-through mode that may asynchronously pass the data input directly to the output of latch 125, for example, without delaying or sampling the input based on a clocking signal. One or more components of the SYSREF generation circuit 100 are coupled, in various embodiments, to processing logic (e.g., such as the digital logic 140) that is also coupled to the device clock 135 and other components or devices such that the processing logic is capable of resetting at least some of the components of the SYSREF generation circuit 100 synchronously with the other components or devices based on the device clock signal output by the device clock 135.

The SYSREF generation circuit 100 is configured to receive a device clock signal from the device clock 135 and convert the device clock signal to the SYSREF clock. The device clock signal may have a higher frequency than a desired frequency of the SYSREF clock. For example, the device clock frequency may have a frequency of greater than about 1 GHz, greater than about 5 GHz, greater than about 10 GHz, greater than about 12 GHz, greater than about 15 GHz, or any other suitable frequency. In some embodiments, to comply with the JESD204B standard, the SYSREF clock may have a frequency of less than or equal to about 100 MHz. In other embodiments, the SYSREF clock may have a frequency of greater than or less than 100 MHz according to compliance specifications of a desired standard and/or desired operational performance. Generally, the frequency of the SYSREF clock is an integer division of the device clock frequency.

The device clock signal received by the SYSREF generation circuit 100 from the device clock 135 may have a substantially higher frequency than the SYSREF clock output by the SYSREF generation circuit 100. In some embodiments, the device clock signal received from the device clock 135 may be directly passed to the SYSREF divider 115 and the interpolator 110 at the frequency received from the device clock 135. In other embodiments, the frequency divider 105 may receive the device clock signal from the device clock 135 and divide the device clock signal to reduce a frequency of the device clock signal. For example, the frequency divider 105 may receive a device clock signal having a first frequency and divide the first frequency by a fixed value to form a divided clock signal. In some embodiments, the fixed value may be determined and preconfigured in the frequency divider 105 at a time of manufacture of the SYSREF generation circuit 100. In such embodiments, the fixed value may be unchangeable. In other embodiments, the fixed value may programmable by processing logic which may be coupled to the frequency divider 105. For example, the frequency divider 105 may be coupled to the digital logic 140 such that the digital logic 140 provides the frequency divider 105 with the fixed value for use in dividing the device clock signal to form the divided clock signal. In some embodiments, the divided clock signal output by the frequency divider 105 may have a frequency of about one-sixteenth of a frequency of the device clock signal. In other embodiments, the divided clock signal output by the frequency divider 105 may have any suitable frequency determined according to the fixed value.

The SYSREF divider 115 is configured to receive the divided clock signal received from the frequency divider 105 (or the device clock signal from the device clock 135 when the frequency divider 105 is not implemented) and further divide the received clock signal to form the SYSREF clock. In some embodiments, the SYSREF divider 115 divides the received clock signal by a fixed amount, for example, that may be predetermined and programmed to the SYSREF divider 115 at a time of manufacture. In other embodiments, the SYSREF divider 115 may receive input that comprises a value for use in dividing the received clock signal. For example, the input may be received from the digital logic 140. In some embodiments, the input is an 11-bit digital value specifying an amount by which the SYSREF divider 115 should divide the received clock to form the SYSREF clock. As such, a frequency of the SYSREF clock may be programmable by altering the value provided as input to the SYSREF divider 115. In some embodiments, the frequency of the SYSREF clock may be less than or equal to about 100 MHz. In other embodiments, the SYSREF clock may have a frequency of greater than or less than 100 MHz according to compliance specifications of a desired standard and/or desired operational performance.

The interpolator 110 comprises a plurality of DACs (depicted in FIG. 2) and one or more clock generators (not shown). The interpolator is, in some embodiments, an analog phase interpolator. In other embodiments, the interpolator may be any other form of interpolator or device that provides substantially similar functionality. The clock generators may be, for example, IQ clock generators. An IQ clock generator, in some embodiments, generates clock signals that are phase shifted with respect to one another (e.g., such as an I clock signal at a first phase and a Q clock signal that is 90 degrees phase shifted with respect to the I clock signal) and, optionally, inverses of the I and Q clock signals. Based on the divided clock signal received from the frequency divider 105 (or the device clock signal received from the device clock 135 when the frequency divider 105 is not implemented), the interpolator 110 generates a plurality of clock signals. For example, the interpolator 110 may generate a first clock signal, a second clock signal that is a complement or inverse of the first clock signal, a third clock signal that is phase shifted ninety degrees from the first clock signal, and a fourth clock signal that is a complement or inverse of the third clock signal. Based at least in part on an input received by each of the DACs and the generated clock signals, the interpolator 110 generates an interpolator output. The interpolator output is provided to the latch 125 to control when the latch 125 outputs a value of the SYSREF clock received from the SYSREF divider 115 (e.g., such that the SYSREF clock received from the SYSREF divider 115 is sampled by the latch 125 using the interpolator output) after the latch 125 has been triggered to provide output of the sampled SYSREF clock. In this way, the interpolator output may phase shift or move the SYSREF clock at a high degree of granularity (e.g., delay resolutions, in some embodiments, of about 8.5 pS). For example, the interpolator output may delay storage of the SYSREF clock while enabling the SYSREF clock to maintain a same frequency despite the delay. Delaying the SYSREF clock according to the interpolator 110, in some embodiments, enables tuning of a location of a rising edge of the SYSREF clock with a high degree of granularity, for example, such that the delay facilitates multiple possible locations of the rising edge of the SYSREF clock within the valid assertion window, discussed above.

The interpolator output is provided by the interpolator 110 and received by the latch 125 at a clock input of the latch 125. The latch 125 also receives the output of the multiplexer 120 at a data input of the latch 125. When a signal received by the latch 125 at the clock input is high (e.g., a logical "1"), the latch 125 may output the data input of the latch 125 as an output. For example, the latch 125 may sample the data input at the positive edge (e.g., the low-to-high transition) of the signal received at the clock input, and output the sampled data when the clock input signal is high. In other embodiments, the latch 125 may sample the data input at a negative edge (e.g., the high-to-low transition of the signal received at the clock input. In this way, the signal received at the clock input of the latch 125 may sample the signal received at the data input of the latch 125, thereby forming a sampled SYSREF clock signal for output by the SYSREF generation circuit 100.

In some embodiments, the SYSREF clock may be desired for use at some, but not necessarily all, times in a device coupled to the SYSREF generation circuit 100. To enable selective output of the SYSREF clock, the latch 125 is configured to output the SYSREF clock when the latch 125 receives a trigger signal. The latch 125 receives the trigger signal, in some embodiments, from the trigger generator 130. In other embodiments, the trigger generator 130 may not be present in the SYSREF generation circuit 100 and the latch 125 may receive the trigger from other processing logic (e.g., such as the digital logic 140) which may be located outside of the SYSREF generation circuit 100.

Figure 2:
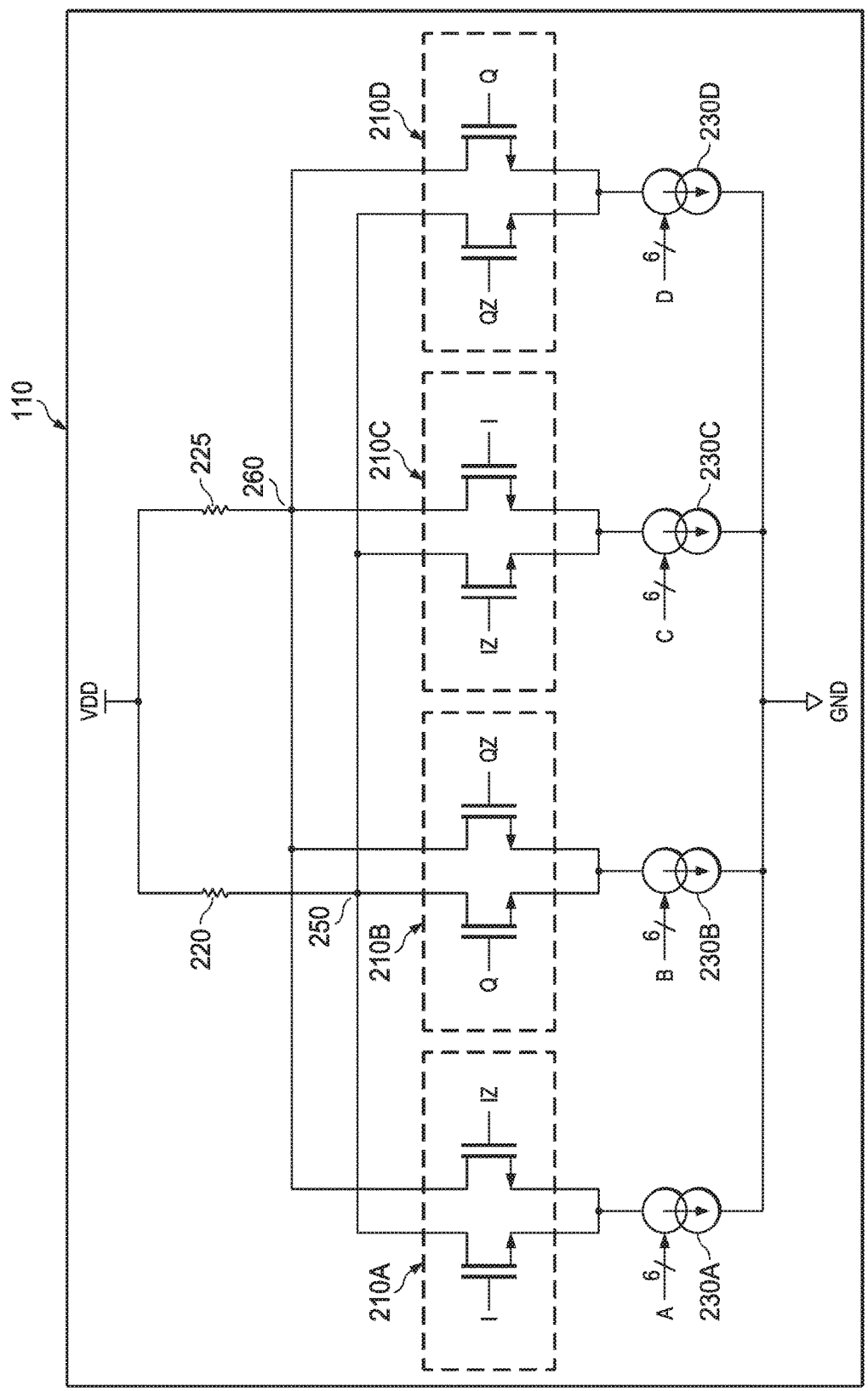
FIG. 2 shows a schematic diagram of an illustrative interpolator in accordance with various embodiments.

FIG. 2 is a schematic diagram of an illustrative interpolator 110. As discussed above, the interpolator comprises a plurality of clock generators (not shown). The clock generators are configured to receive the divided clock signal from the frequency divider 105 (or receive the device clock signal from the device clock 135 when the frequency divider 105 is not implemented) and generate a plurality of clock signals. For example, the clock generators may generate a first clock signal (illustrated in FIG. 2 as I), a second clock signal that is a complement or inverse of the first clock signal (illustrated in FIG. 2 as IZ), a third clock signal that is phase shifted ninety degrees from the first clock signal (illustrated in FIG. 2 as Q), and a fourth clock signal that is a complement or inverse of the third clock signal (illustrated in FIG. 2 as QZ). In some embodiments, the clock generators may further divide the frequency of the received clock signal (e.g., such as by 2) when forming the first, second, third, and fourth clock signals. In some embodiments, the clock generators may be included in frequency divider 105 and/or frequency divider 105 may generate some, or all, of the first, second, third, or fourth clock signals.

The interpolator 110 further comprises a plurality of differential amplifiers 210 (illustrated respectively in FIG. 2 as 210A, 210B, 210C, and 210D). Each of the differential amplifiers 210 comprises a pair of metal oxide semiconductor field effect transistors (MOSFETs) 215, for example, a pair of n-type MOSFETs. In other embodiments, the differential amplifiers may comprise other forms of transistors or input devices. The interpolator 110 further comprises load resistor 220 coupled to a drain terminal of each of a first subset of the MOSFETs 215 and load resistor 225 coupled to a drain terminal of each of a second subset of the MOSFETs 215. The interpolator further comprises a plurality of DACs 230 (illustrated respectively in FIG. 2 as 230A, 230B, 230C, and 230D), where each DAC 230 is respectively coupled to one of the plurality of differential amplifiers 210. While one particular architecture of the interpolator 110 is illustrated herein for the sake of clarity and ease of understanding, the interpolator 110 may be implemented according to other architectures that provide a substantially similar functionality, all of which are encompassed by the present disclosure. For example, in some embodiments, the load resistors 220 and 225 may each be replaced by a transistor or other electrical component.

Each of the differential amplifiers 210 receives two different clock signals from among the four clock signals generated by the clock generators. For example, in at least some embodiments the differential amplifier 210A receives clock signals I and IZ, the differential amplifier 210B receives clock signals Q and QZ, the differential amplifier 210C receives clock signals IZ and I, and the differential amplifier 210D receives clock signals QZ and Q. In this way, using the two clock signals I and Q which are 90 degrees phase shifted and the two complements IZ and QZ of the clock signals I and Q, respectively, the interpolator 110 may cover a full 360 degree range of possible phases (e.g., a respective 90 degrees of the phase covered by each of the differential amplifiers 210).

Each of the DACs 230 is implemented as a variable bias current circuit, each configured to receive a respective digital signal and sink an amount of current from a power supply (VDD) to ground (GND) through at least one of the load resistor 220 and/or the load resistor 225 and at least some of the differential amplifiers 210. The amount of current sunk by the DACs 230 may be determined, at least in part, according to a value of the digital signal received by the DACs 230. For example, in some embodiments, each of the DACs 230 may receive about 6-bits of input. The input may be received, for example, from the digital logic 140 and/or from any other suitable input source. The amount of current being sunk through the respective DACs 230 may determine a phase of the interpolator output. For example, when the interpolator 110 receives about 24 bits of input (e.g., 6 bits for each of the DACs 230), the interpolator 110 may have a delay (or movement/shift step) resolution of about 8.5 pS at a device clock frequency of about 15 GHz.

To adjust a delay of the output of the interpolator 110 (e.g., to move or delay the SYSREF clock), a value of an input to at least one of the DACs 230 may be increased and/or a value to at least one of the DACs 230 may be decreased. Increasing (or decreasing) the value of an input to a DAC 230 pushes a phase of the output of the interpolator 110 toward (or away) from a phase of the respective clock signal received by the differential amplifier 210 coupled to the respective DAC 230. For example, by increasing a value of the input to the DAC 230A, an output of the interpolator 110 may have a phase closer to that of the clock I. Similarly, by increasing a value of the input to the DAC 230B, an output of the interpolator 110 may have a phase closer to that of the clock Q. As another example, because the clock I and the clock Q are phase shifted by 90 degrees, when the value of the input to the DAC 230A is substantially the same as the value of the input to the DAC 230B, the output of the interpolator 110 may have a phase of about 45 degrees. An output of the interpolator 110 may be taken at one, or both, of node 260 and/or node 250.

Figure 3:
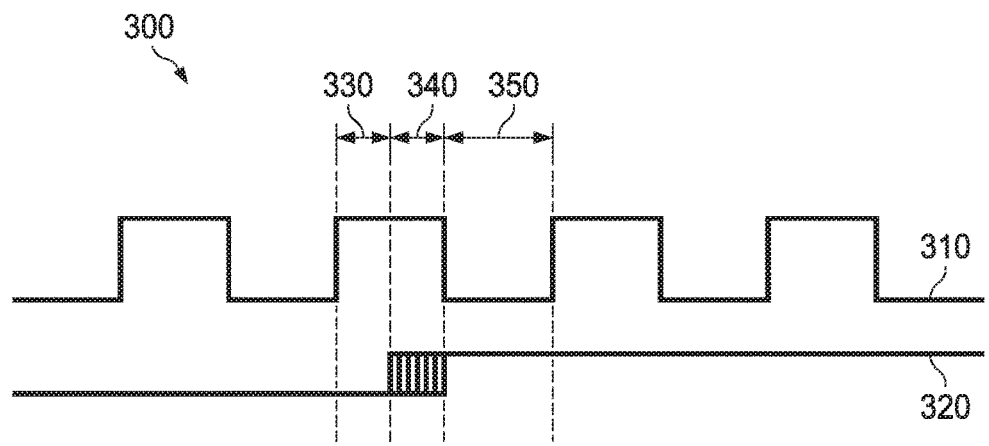
FIG. 3 shows an illustrative timing diagram of a device clock and SYSREF clock in accordance with various embodiments.

FIG. 3 is an illustrative timing diagram 300 of a device clock 310 signal and a SYSREF clock 320 in accordance with various embodiments. The timing diagram 300 illustrates a valid assertion window 340 for a SYSREF clock 320. The valid assertion window 340 of the SYSREF clock 320 may extend from the end of a hold window 330 to the beginning of a setup window 350 of the device clock 310 upon which the SYSREF clock 320 is based. The hold window 330, in some embodiments, may describe a period of time for which the SYSREF clock 320 should remain at a single valid logic level (logic low or logic high) without change. The setup window 350, in some embodiments, may describe a period of time during which the SSYREF clock 320 may be permitted to change logic levels. In some embodiments, the valid assertion window 340 may be considered a part of the setup window 350, in which case a beginning of the valid assertion window 340 is also beginning of the setup window 350. Generally, the SYSREF clock 320 may be prohibited from changing states (from high or active to low or inactive (or vice versa)) prior to the end time of the hold window 330 and/or after a start time of the setup window 350. In some embodiments, the hold window 330 may begin at a rising edge of a period of the device clock 310 and extend for an amount of time about equal to one-quarter of the period of the device clock 310. In some embodiments, the setup window 350 may begin at a falling edge of the period of the device clock 310 and extend for an amount of time about equal to one-half of the period of the device clock 310. In such embodiments, the valid assertion window 340 may exist between the hold window 330 and the setup window 350 and be about one-quarter of the period of the device clock 310. In some embodiments, because of the comparatively short time of the valid assertion window 340 for devices having a high frequency device clock 310, it may be desirable to provide multiple possible locations of a rising edge of the SYSREF clock 320 within the valid assertion window 340 to provide an increased chance for a component operating at about the speed of the device clock 310 to capture the SYSREF clock 320. As discussed above, the SYSREF generation circuit 100 may provide one or more possible locations of the rising edge of the SYSREF clock 320 within the valid assertion window 340 by delaying (e.g., phase shifting or moving) the SYSREF clock 320 according to an output of the interpolator 110.

Figure 4:
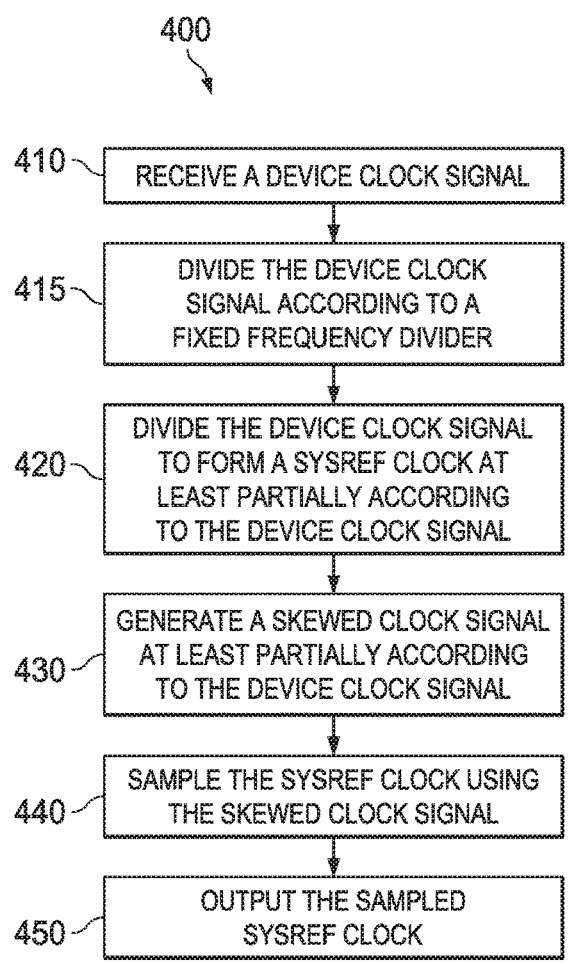
FIG. 4 shows a flowchart of an illustrative method of SYSREF generation in accordance with various embodiments.

FIG. 4 is a flowchart of an illustrative method 400 of SYSREF generation in accordance with various embodiments. The method 400 is implemented, in some embodiments, by an electrical component such as, or comprising, the SYSREF generation circuit 100 for generation of a SYSREF clock according to a received device clock.

At operation 410, the electrical component receives a device clock signal. The device clock signal is, in some embodiments, a high frequency clock signal. The high frequency clock signal is, in various embodiments, 1 GHz, greater than about 10 GHz, greater than about 12 GHz, greater than about 15 GHz, or any other comparatively high frequency, for example, on the order of at least GHz. The device clock signal may be shared among the electrical component and other elements of a single electrical device.

At operation 420, the electrical component divides the device clock signal to form a SYSREF clock signal at least partially according to the device clock signal. The SYSREF clock signal, in some embodiments, is less than or equal to about 100 MHz. The device clock signal, in some embodiments, is divided according to a value received from processing logic. The processing logic may be included within the same electrical device as the electrical component or the processing logic may be located in a separate electrical device. In some embodiments, the value received from the processing logic is an 11-bit value.

At operation 430, the electrical component generates a shifted clock signal at least partially according to the device clock signal. The shifted clock signal is generated, for example, by an interpolator such as the interpolator 110, discussed above. In some embodiments, the electrical component receives a plurality of digital signals configured to move or phase shift the shifted clock signal toward, or away from, a first phase (e.g., of a first clock signal) to a second phase (e.g., of a second clock signal). Each of the digital signals, in some embodiments, comprises 6 bits. Optionally, the operation 430 further includes generating a first clock signal at least partially based on a received clock signal, generating a second clock signal that has a phase 90 degrees from a phase of the first clock signal, and generating complements of the first clock signal and the second clock signal.

At operation 440, the electrical component samples the SYSREF clock using the shifted clock signal output by the interpolator. The electrical component samples the SYSREF clock, for example, using a latch such as the latch 125 that outputs a value of the SYSREF clock at a rising edge of the shifted clock signal (e.g., by sampling the SYSREF clock using the shifted clock signal to form a sampled SYSREF clock for output).

At operation 450, the electrical component outputs the sampled SYSREF clock. The electrical component outputs the sampled SYSREF clock (which may also be referred to as a delayed SYSREF clock, a shifted SYSREF clock, and/or a phase-shifted SYSREF clock), in some embodiments, in response to receipt of a trigger for outputting the sampled SYSREF clock.

Optionally, after receiving the device clock signal, at step 415 the electrical component divides the device clock signal according to a fixed frequency divider prior to providing the divided device clock for processing according to operations 420 and 430.

While the operations of the method 400 have been discussed and labeled with numerical reference, the method 400 may include additional operations that are not recited herein, any one or more of the operations recited herein may include one or more sub-operations, any one or more of the operations recited herein may be omitted, and/or any one or more of the operations recited herein may be performed in an order other than that presented herein (e.g., in a reverse order, substantially simultaneously, overlapping, etc.), all of which is intended to fall within the scope of the present disclosure.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other intervening devices and/or connections. Unless otherwise stated, "about," "approximately," or "substantially" preceding a value means+/−10 percent of the stated value or reference.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An apparatus, comprising:
   a device clock configured to generate a device dock signal; and
   a synchronization (SYSREF) clock generation circuit configured to receive the device clock signal from the device clock, wherein the SYSREF generation circuit comprises:
      a SYSREF divider configured to generate a SYSREF clock based at least on the device clock signal;
      an interpolator configured to generate a shifted clock based at least on the device clock signal; and
      a latch coupled to the SYSREF divider and the interpolator and configured to sample the SYSREF clock at a rising edge of the shifted clock.

2. The apparatus of claim 1, further comprising a frequency divider configured to divide the device clock signal and to transmit the divided device clock signal to the SYSREF divider and the interpolator.

3. The apparatus of claim 1, wherein the interpolator is further configured to divide a received clock signal to form a first clock signal, a second clock signal, a complement of the first clock signal, and a complement of the second clock signal, and wherein the second clock signal is phase shifted 90 degrees relative to the first clock signal.

4. The apparatus of claim 3, wherein the interpolator further comprises a plurality of variable current circuits, each of which is configured to receive a digital value and sink an amount of current according to the digital value, and wherein the interpolator is further configured to generate the shifted clock according to the first clock signal, the second clock signal, and the digital value.

5. The apparatus of claim 4, wherein the shifted clock has a resolution of about 8.5 picoseconds (pS).

6. The apparatus of claim 5, wherein the device clock has a frequency of about 15 gigahertz (GHz), and wherein the SYSREF clock has a frequency of less than about 100 megahertz (MHz).

7. The apparatus of claim 4, wherein a resolution of the shifted clock depends at least in part on a number of bits of the digital value.

8. The apparatus of claim 1, further comprising a trigger generator coupled to the latch and configured to:
   receive an instruction to generate a trigger to cause the latch to output the sampled SYSREF clock; and
   transmit the trigger to the latch.

9. The apparatus of claim 8, further comprising a multiplexer configured to:
   receive the SYSREF clock from the SYSREF divider as a first input;
   receive an external clock signal as a second input; and
   output the first input or the second input to the latch according to a select signal received by the multiplexer.

10. An apparatus configured to generate a synchronization (SYSREF) signal, comprising:
- a frequency divider configured to generate the SYSREF signal by dividing a device clock signal to a frequency less than about 100 megahertz (MHz);
- an analog phase interpolator configured to generate a delay signal by dividing the device clock signal to form a first clock signal and a second clock signal having a phase shift of 90 degrees with respect to the first clock signal; and
- a latch configured to output the SYSREF signal according to the delay signal.

11. The apparatus of claim 10, wherein the delay signal is delayable a plurality of delay steps separated at a resolution of about 8.5 picoseconds (pS).

12. The apparatus of claim 10, wherein the latch outputting the SYSREF signal according to the delay signal comprises:
- sampling, by the latch, the SYSREF signal according to the delay signal; and
- outputting, by the latch, the sampled SYSREF signal in response to receipt of a SYSREF signal request trigger.

13. The apparatus of claim 12, wherein the latch outputs the sampled SYSREF signal during a valid assertion window of the device clock according to the delay signal.

* * * * *